United States Patent
Chang et al.

(10) Patent No.: US 11,698,692 B2
(45) Date of Patent: Jul. 11, 2023

(54) TRANSMITTER AND METHOD FOR TRANSMITTING SIGNAL VALUE

(71) Applicant: EGALAX_EMPIA TECHNOLOGY INC., Taipei (TW)

(72) Inventors: Chin-Fu Chang, Taipei (TW); Shang-Tai Yeh, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 0 days.

(21) Appl. No.: 17/701,730

(22) Filed: Mar. 23, 2022

(65) Prior Publication Data

US 2022/0308678 A1 Sep. 29, 2022

(30) Foreign Application Priority Data

Mar. 23, 2021 (TW) .................................. 110110532

(51) Int. Cl.
*G06F 3/038* (2013.01)
*H03K 17/96* (2006.01)
*G06F 3/0354* (2013.01)

(52) U.S. Cl.
CPC .......... *G06F 3/038* (2013.01); *G06F 3/03545* (2013.01); *H03K 17/962* (2013.01); *H03K 2017/9606* (2013.01)

(58) Field of Classification Search
CPC ... G06F 3/038; G06F 3/03545; H03K 17/962; H03K 2017/9606
See application file for complete search history.

(56) References Cited

U.S. PATENT DOCUMENTS

| | | | |
|---|---|---|---|
| 10,437,358 B2 | 10/2019 | Geaghan et al. | |
| 2013/0321358 A1 | 12/2013 | Park et al. | |
| 2015/0153845 A1* | 6/2015 | Chang | G06F 3/04162 345/179 |
| 2017/0083120 A1* | 3/2017 | Huang | G06F 3/0383 |
| 2019/0004649 A1* | 1/2019 | Ju | G06F 3/0446 |

FOREIGN PATENT DOCUMENTS

TW    I627563    6/2018

* cited by examiner

*Primary Examiner* — Peter D McLoone
(74) *Attorney, Agent, or Firm* — WPAT, P.C

(57) ABSTRACT

A transmitter comprising: a signal modulator for transmitting electrical signals via an electrode, wherein the electrical signals carry a message representing a signal value; and a controller, coupled to the signal modulator, configured for having the signal modulator transmitting the electrical signals with a first duty cycle in a reference signal time period and transmitting the electrical signals with a second duty cycle in a modulation signal time period, wherein a first ratio corresponding to the second duty cycle and the first duty cycle is corresponding to the signal value, wherein the lengths of the reference signal time period and the modulation signal time period are the same, and wherein the maximum amplitudes of the electrical signals during the reference signal time period and the modulation signal time period are the same.

14 Claims, 14 Drawing Sheets

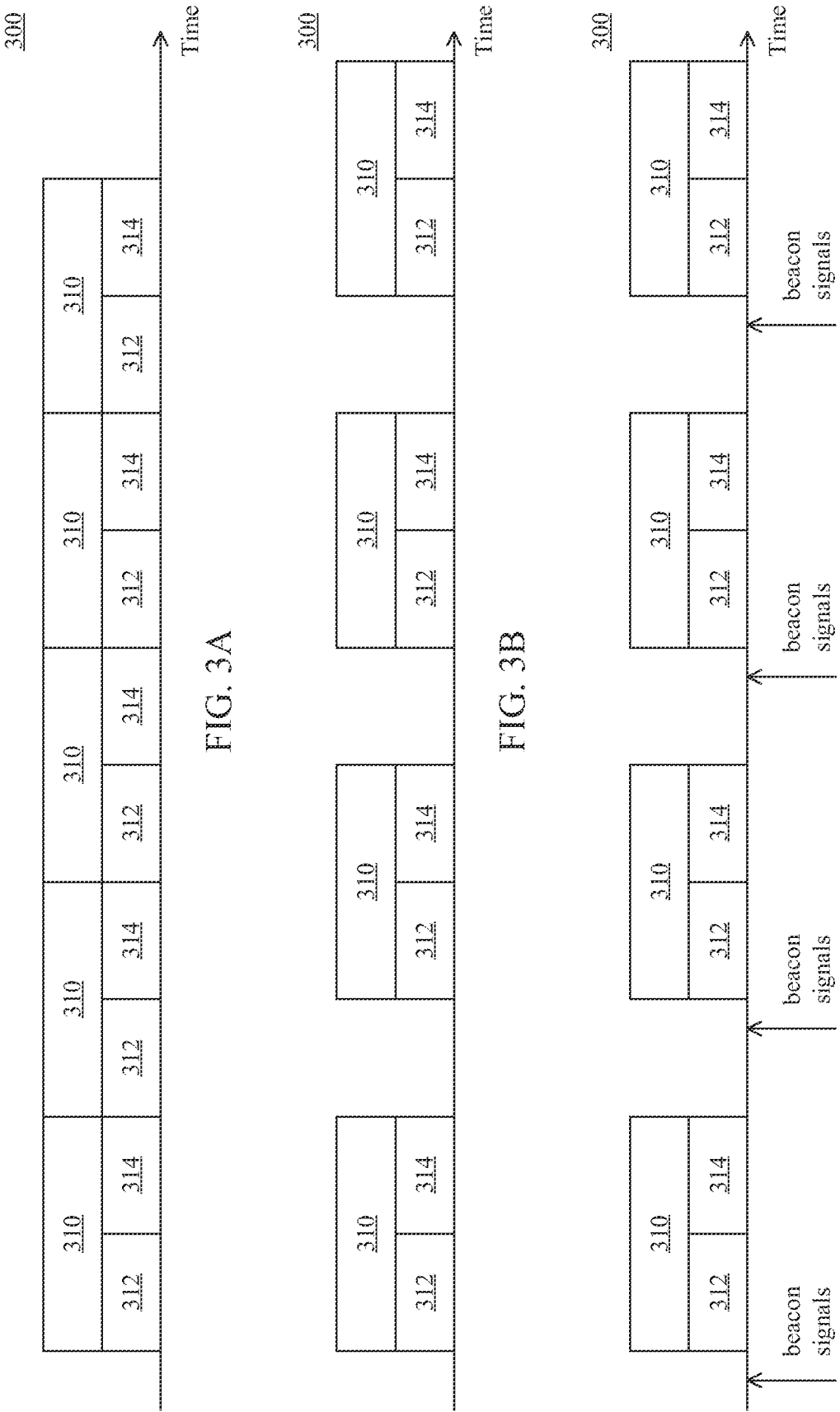

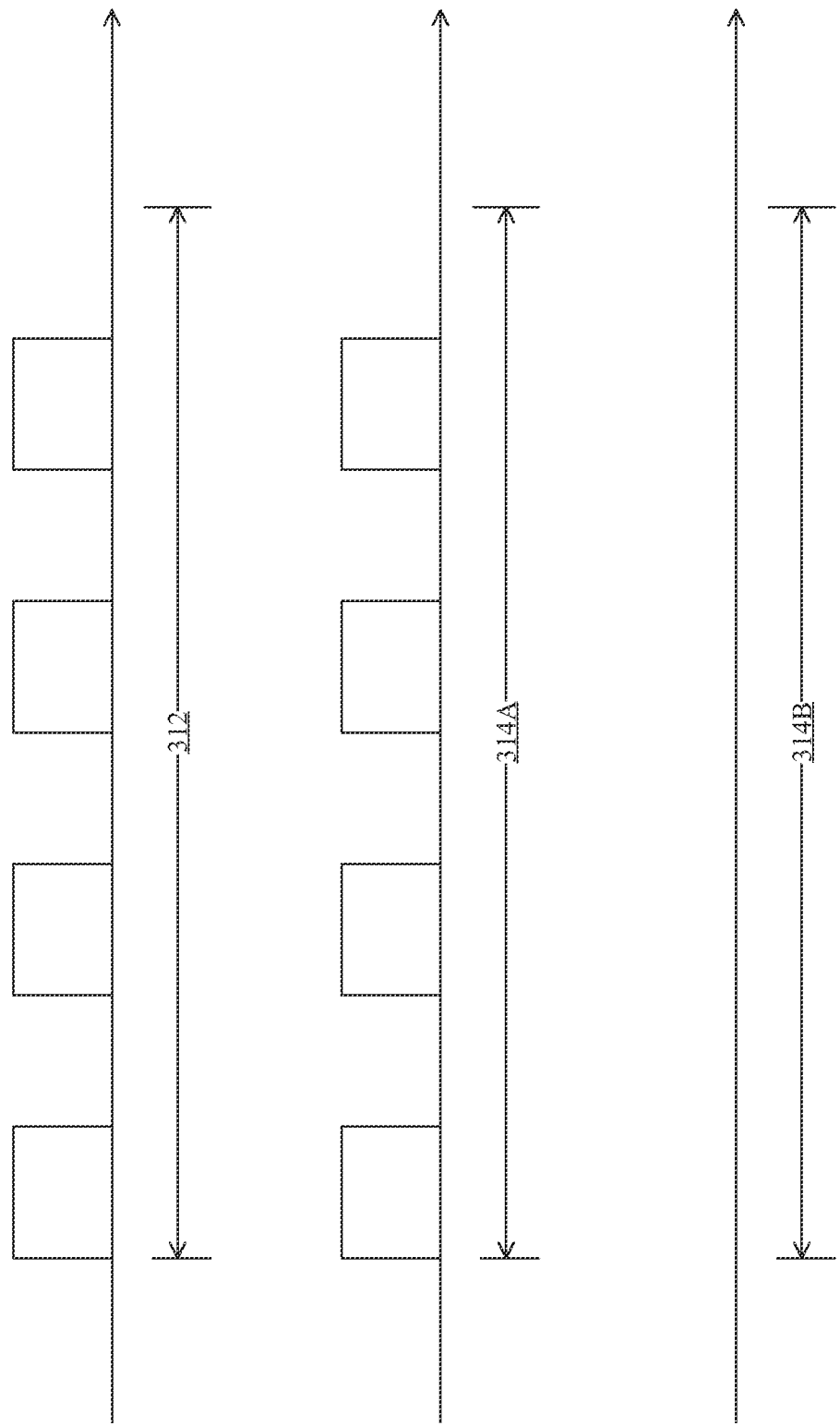

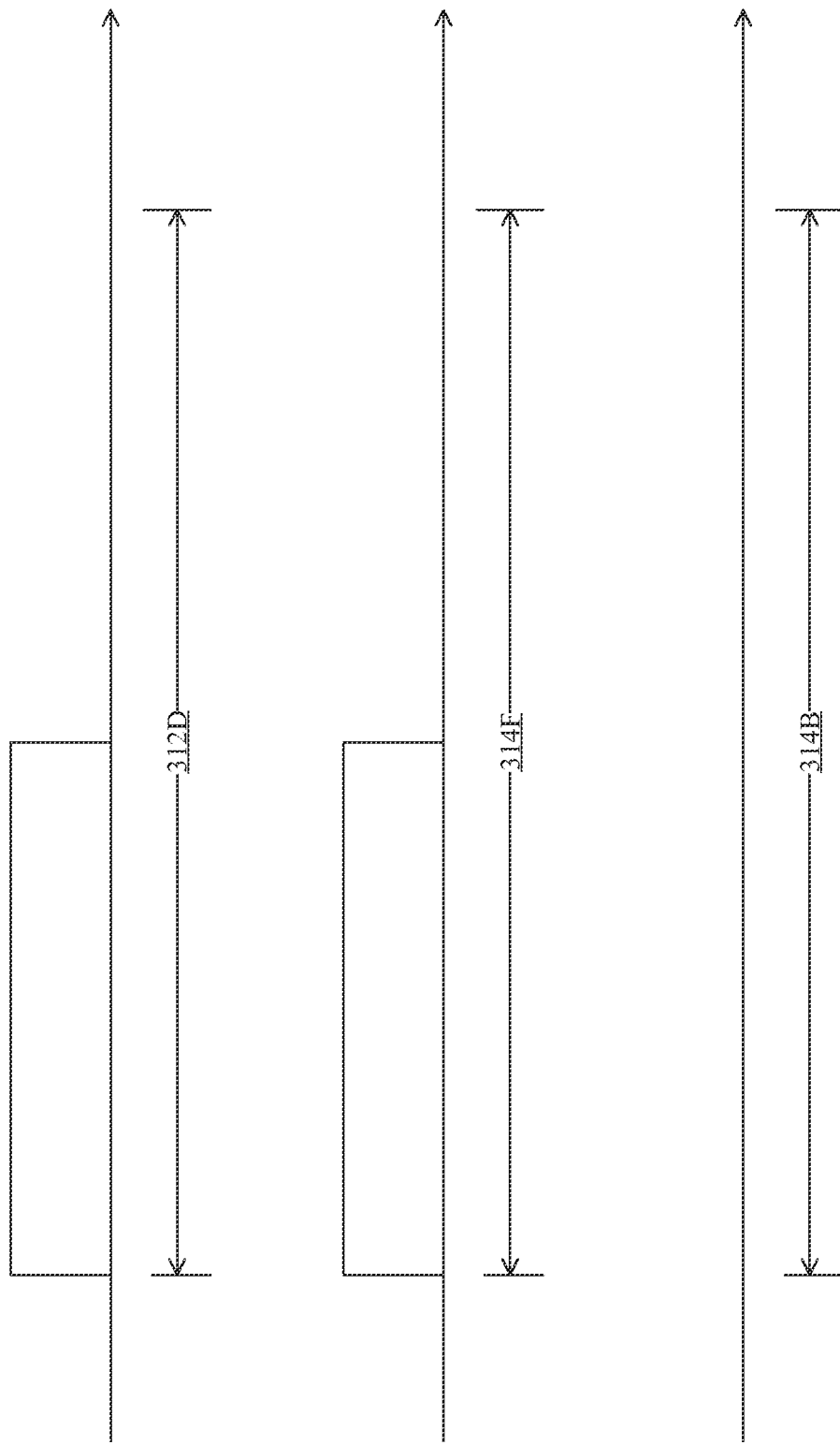

TRANSMITTER AND METHOD FOR TRANSMITTING SIGNAL VALUE

CROSS REFERENCE TO RELATED PATENT APPLICATION

This patent application is based on a Taiwan, R.O.C. patent application No. 110110532 filed on Mar. 23, 2021.

FIELD OF THE INVENTION

The present invention relates to stylus, and more particularly, to modulation and demodulation of electric signals emitted from stylus.

BACKGROUND OF THE INVENTION

A stylus usually transmits electric signals via an electrode disposed at a tip of the stylus or near the tip to a touch panel or screen. A touch sensitive processing apparatus senses the electric signals via touch electrodes of the touch panel or screen. Transferring sensing information of the stylus to the touch sensitive processing apparatus needs modulation of the electric signals at the stylus and demodulation of the electric signals at the touch sensitive processing apparatus.

SUMMARY OF THE INVENTION

According to an embodiment of the present application, it provides a transmitter for transmitting a signal value. The transmitter comprising: a signal modulator for transmitting electrical signals via an electrode, wherein the electrical signals carry a message representing a signal value; and a controller, coupled to the signal modulator, configured for having the signal modulator transmitting the electrical signals with a first duty cycle in a reference signal time period and transmitting the electrical signals with a second duty cycle in a modulation signal time period, wherein a first ratio corresponding to the second duty cycle and the first duty cycle is corresponding to the signal value, wherein the lengths of the reference signal time period and the modulation signal time period are the same, and wherein the maximum amplitudes of the electrical signals during the reference signal time period and the modulation signal time period are the same.

According to an embodiment of the present application, it provides a method for transmitting a signal value. The method comprising: transmitting electrical signals with a first duty cycle via an electrode during a reference signal time period, wherein the electrical signals carry a message representing the signal value; and transmitting the electrical signals with a second duty cycle during a modulation signal time period, wherein a first ratio corresponding to the second duty cycle and the first duty cycle is corresponding to the signal value, wherein the lengths of the reference signal time period and the modulation signal time period are the same, wherein the maximum amplitudes of the electrical signals during the reference signal time period and the modulation signal time period are the same.

According to an embodiment of the present application, it provides a touch sensitive processing apparatus for receiving a signal value. The touch sensitive processing apparatus comprising: a sensing circuit module for connecting multiple touch electrodes of a touch panel in order to detect electrical signals emitted from a transmitter, wherein the electrical signals carry a message representing a signal value; and a processor module, coupled to the sensing circuit module, configured for executing instructions stored in non-volatile memory for realize following: having the sensing circuit module sensing a first characteristic value of the electrical signals received in a reference signal time period; having the sensing circuit module sensing a second characteristic value of the electrical signals, having a first number of waves, received in a first modulation signal time period; having the sensing circuit module sensing a third characteristic value of the electrical signals, having a second number of waves, received in a second modulation signal time period; calculating a first ratio of the second characteristic value and the first characteristic value and calculating a second ratio of the third characteristic value and first characteristic value; and calculating the signal value according to a function of the first ratio, the second ratio, the first number of waves and the second number of waves.

According to an embodiment of the present application, it provides a touch system for receiving a signal value. The touch system comprises a touch panel including multiple touch electrodes; and the aforementioned touch sensitive processing apparatus.

According to an embodiment of the present application, it provides a touch sensitive processing method for receiving a signal value. The touch sensitive processing method comprising: sensing a first characteristic value of the electrical signals received in a reference signal time period; sensing a second characteristic value of the electrical signals, having a first number of waves, received in a first modulation signal time period; sensing a third characteristic value of the electrical signals, having a second number of waves, received in a second modulation signal time period; calculating a first ratio of the second characteristic value and the first characteristic value and calculating a second ratio of the third characteristic value and first characteristic value; and calculating the signal value according to a function of the first ratio, the second ratio, the first number of waves and the second number of waves.

According to the touch sensitive processing method, apparatus and touch system provided by the present application, a signal value measured onboard a stylus can be transmitted to a touch sensitive processing apparatus via electrical signals transmitted in two or more time periods. Because the electrical signals transmitted in a reference signal time period is referenced, a ratio of the signal strengths or duty cycles in two time periods would not be changed according to various touch electrode density where the stylus points. Besides, two modulations can be applied to the electrical signals to carry more information in the same time.

BRIEF DESCRIPTION OF THE DRAWINGS

The advantages and spirit related to the present invention can be further understood via the following detailed description and drawings.

FIG. 3A shows a timing sequence of an electrical signal transmission in accordance with an embodiment of the present application.

FIG. 3B shows a timing sequence of an electrical signal transmission in accordance with an embodiment of the present application.

FIG. 3C shows a timing sequence of an electrical signal transmission in accordance with an embodiment of the present application.

FIG. 4A shows a timing sequence of an electrical signal transmission in accordance with an embodiment of the present application.

FIG. 4D shows a timing sequence of an electrical signal transmission in accordance with an embodiment of the present application.

DETAILED DESCRIPTION OF THE PREFERRED EMBODIMENT

Figure 1:
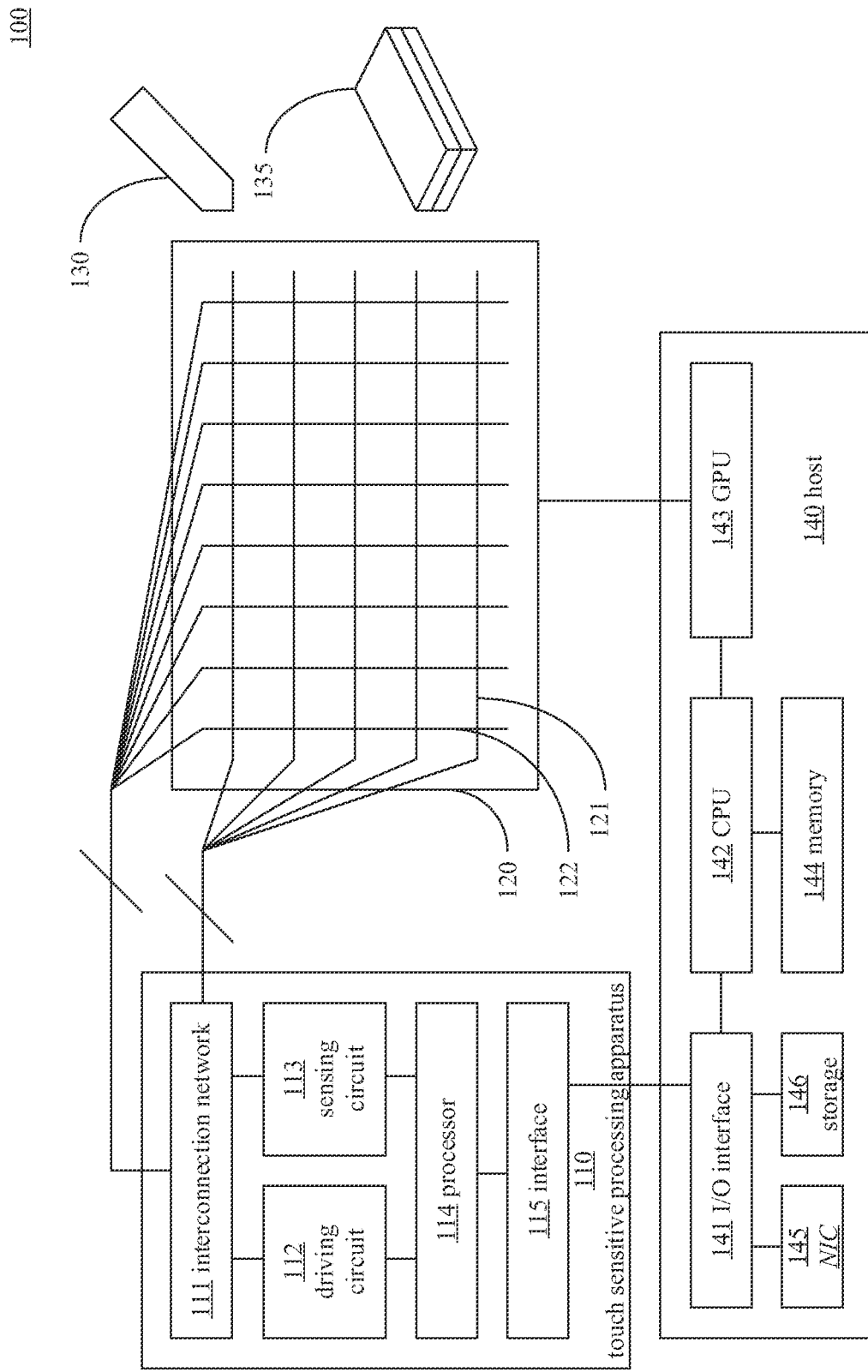
FIG. 1 shows a block diagram of a touch system according to an embodiment of the present invention.

Some embodiments of the present application are described in details below. However, in addition to the description given below, the present invention can be applicable to other embodiments, and the scope of the present invention is not limited by such rather by the scope of the claims. Moreover, for better understanding and clarity of the description, some components in the drawings may not necessary be drawn to scale, in which some may be exaggerated related to others, and irrelevant. If no relation of two steps is described, their execution order is not bound by the sequence as shown in the flowchart diagram.

Please refer to FIG. 1, which shows a block diagram of a touch system 100 according to an embodiment of the present invention. The touch system 100 may be a computer system such as a desktop computer, a laptop computer, a tablet computer, an industrial control computer, a smartphone or any other kinds of computer having touch sensitive function.

The touch system 100 may comprise a touch sensitive processing apparatus 110, a touch panel or screen 120 coupled to the touch sensitive processing apparatus 110, and a host coupled to the touch sensitive processing apparatus 110. The touch system 100 may further comprises one or more styli 130 and/or touch board eraser 135. Hereinafter the touch panel or screen 120 is referred as the touch screen 120. However, in the embodiments lacking of display function, persons having ordinary skill in the art can understand the touch screen denoted in the present application may be referred to a touch panel.

The touch screen 120 may comprise multiple first electrodes 121 in parallel to a first axis and multiple second electrodes 122 in parallel to a second axis. The first electrodes 121 may intersect with the second electrodes 122 in order to form multiple sensing points or sensing areas. Equivalently, the second electrodes 122 may intersect with the first electrodes 121 in order to form multiple sensing points or sensing areas. In some embodiments of the present application, the first electrodes 121 may be referred as first touch electrodes 121 and the second electrodes 122 may be referred as second touch electrodes 122. The first electrodes 121 and the second electrodes 122 may be collectively referred as touch electrodes. In some embodiments with touch screens 120, the first electrodes 121 and the second electrodes 122 are made by transparent material. The first electrodes 121 and the second electrodes 122 may be disposed in one electrode layer. Conductive plates of each one of the first electrodes 121 or the second electrodes 122 may be connected by bridging. The first electrodes 121 and the second electrodes 122 may be disposed at different overlapping electrode layers. Unless described specifically, the present application may be applied to the embodiments having one or more electrode layers. The first axis and the second axis are perpendicular in most cases. However, the present application does not limit that the first axis and the second axis are perpendicular. In one embodiment, the first axis may be a horizontal axis or a pixel refreshing axis of the touch screen 120.

The touch sensitive processing apparatus 110 may comprise following hardware circuit: an interconnection network module 111, a driving circuit module 112, a sensing circuit module 113, a processor module 114, and an interface module 115. The touch sensitive processing apparatus 110 may be implemented inside a single integrated circuit which may include one or more chips. It may use multiple integrated circuits and an interconnected circuit board carried the multiple integrated circuits to realize the touch sensitive processing apparatus 110. The touch sensitive processing apparatus 100 may be implemented in single integrated circuits with the host 140. The present application does not limit how to implement the touch sensitive processing apparatus 110.

The interconnection network module 111 is configured to connect each of the multiple first electrodes 121 and/or the multiple second electrodes 122 of the touch screen 120. The interconnection network module 111 may follow control command of the processor module 114 for connecting the driving circuit module 112 and any one or more touch electrodes and for connecting the sensing circuit module 113 and any one or more touch electrodes. The interconnection network module 111 may include a combination of one or more multiplexers (MUX) to realize the aforementioned functions.

The driving circuit module 112 may comprise clock generator, frequency divider, frequency multiplier, phase lock loop, power amplifier, DC-DC voltage converter, regulator and/or filter, which is configured to provide driving signal to any one or more touch electrodes via the interconnection network module 111 according to control commands of the processor module 114. The driving signal may be modulated by kinds of analog or digital modulations for carrying some messages. The modulations include but not limit to frequency modulation (FM), phase modulation, amplitude modulation, dual sideband modulation (DSB), single sideband module (SSB-AM), vestigial sideband modulation, amplitude shift keying (ASK), phase shift keying (PSK), quadrature amplitude modulation (QAM), frequency shift keying (FSK), continuous phase modulation (CPM), code division multiple (CDMA), time division multiple access (TDMA), orthogonal frequency division multiplexing (OFDM), pulse width modulation (PWM) and etc. The driving signal may include one or more square waves, sinuous waves or any modulated waves. The driving circuit module 112 may include one or more channel. Each channel may be connected to any one or more touch electrodes via the interconnection network module 111.

The sensing circuit module 113 may comprise integrator, sampler, clock generator, frequency divider, frequency multiplier, phase lock loop, power amplifier, operational amplifier, DC-DC voltage converter, regulator and/or filter, which is configured to sense on any one or more touch electrodes via the interconnection network module 111 according to control commands of the processor module 114. When the touch signal is transmitted from one of the touch electrodes, another touch electrode may induce the touch signal. And the sensing circuit module 130 may demodulate the induced touch signal by the another touch electrode in accordance with the modulation method performed on the driving signal by the driving circuit module 112 in order to restore the messages carried by the driving signal. The sensing circuit module 113 may include one or more channels. Each channel may be connected to any one or more touch electrodes via the interconnection network module 111. At the same time, each channel may simultaneously perform sensing and demodulation.

In one embodiment, the driving circuit module 112 and the sensing circuit module 113 may include analog front-end (AFE) circuits. In another embodiment, in additional to the AFE circuits, the driving circuit module 112 and the sensing circuit module 313 may include digital back-end (DBE) circuits. If the driving circuit module 112 and the sensing circuit module 113 include only the AFE circuits, the DBE circuits may be implemented in the processor module 114.

The processor module 114 may include a digital signal processor for connecting the AFE circuits or the DBE circuits of the driving circuit module 112 and the sensing circuit module 113, respectively. The processor module 114 may include an embedded processor, non-volatile memories and volatile memories. Normal or real-time operating system (OS) and their application programs may be stored in the non-volatile memories. The OS and the application programs include multiple instructions and data. The processor (including the embedded processor and the digital signal processor) may execute the instructions for controlling other modules including the interconnection network module 111, the driving circuit module 112, the sensing circuit module 113 and the interface module 115 of the touch sensitive processing apparatus 110. For examples, the processor 114 may comprises processors widely adopted in the industry such as 8051 series, Intel i960 series, ARM Cortex-M series and etc. The present application does not limit types and numbers of processor cores included in the processor module 114.

The instructions and data may be used to implement each of steps mentioned in the present application and flows and methods constructed by the steps. Some instructions may be executed independently inside the processor module 114, for examples, arithmetic and log operation instructions. Other instructions may be used to control other circuits of the touch sensitive processing apparatus 110. These instructions may include input/output interfaces of the processor module 114 to control other circuits. Other circuits may provide information via the input/output interface of the processor module 114 to the OS and/or application programs executed by the processor module 114. Persons having ordinary skill in the art should have common knowledge of computer organization and architecture which enabling them to understand that the flows and methods provided by the present application can be realized by the circuits and the instructions.

The interface module 115 may include kinds of serial or parallel bus, such as universal serial bus (USB), $I^2C$, peripheral component interconnect (PCI), PCI-Express, IEEE 1394 and other industrial standard input/output interface. The touch sensitive processing apparatus 110 connects to the host 140 via the interface module 115.

The touch system 100 may comprise one or more styli 130 and/or touch board erasers 135. The stylus 130 and touch board eraser 135 may be transmitters which emit electrical signals. The transmitters may include active transmitter which actively emits electrical signals or passive transmitters which emit electrical signals in response to external electrical signals. The stylus 130 and touch board eraser 135 may comprise one or more electrodes which is configured to receive electrical signals from the touch screen 120 synchronously or asynchronously, or to transmit electrical signals to the touch screen 120 synchronously or asynchronously. The electrical signals may be modulated according to one or more of the aforementioned modulation methods.

The stylus 130 or touch board eraser 135 may be conductor which is configured to transmit driving signals or to be grounded via user's hand or body. The stylus 130 or touch board eraser 135 may be physically or wirelessly connected to an I/O interface 141 of the host 140 or any other interfacing circuits of the I/O interface 141.

The touch sensitive processing apparatus 110 may detect one or more external objects 139 such as fingers, palms, or passive styli 130 or touch board erasers 135, or active styli 130 or touch board erasers 135 emitting electrical signals via the touch screen 120. The touch sensitive processing apparatus 110 may utilize mutual-capacitance sensing or self-capacitance sensing to detect external conductive objects. The styli 130 or touch board erasers 135 and touch sensitive processing apparatus 110 may use the aforementioned modulation and demodulation methods to transmit message via the electrical signals. The touch sensitive processing apparatus 110 may detect one or more positions where the styli 130 or touch board erasers 135 touch or approach the touch screen 120, status or sensors (pressure sensor or button) onboard the stylus 130 or touch board eraser 135, orientation angle or inclination angle of the stylus 130 or touch board eraser 135 with respect to the touch screen 120, etc. according to the electrical signals.

The host 140 is a main apparatus for controlling the touch system 100. It may comprise an input/output interface module 141 for connecting the interface module 115, a central processing unit (CPU) module 142, a graphics processor module 143, a memory module 144 connects to the CPU module 142, a network interface module 145 and a storage 146 module connect to the input/output interface module 141.

The storage module 146 comprises non-volatile memory. Common examples are hard disks, electronic erasable rewritable read only memory (EEPROM), or flash memory. The storage module 146 may store normal operating system and application programs executable under the operating system. The network interface module 145 may comprise wired or wireless hardware network interface. The network interface module 145 may be compliant to common industrial standards such as IEEE 802.11 Wireless Local Area Network, IEEE 802.3 Local Area Network, 3G, 4G and/or 5G wireless telecommunication standards, Bluetooth wireless communication standards, and etc.

The CPU module 142 may directly or indirectly connects to the input/output interface module 141, the graphics processor module 143, the memory module 144, the network interface module 145 and the storage module 146. The CPU module 142 may comprise one or more processor or processor cores. Common processors may include Intel, AMD, VIA's x86 and x64 instruction set architecture (ISA) processors, Apple, Qualcomm, MediaTek's ARM ISA processors, or any other types of complex instruction set computer (CISC) or reduced instruction set computer (RISC) processors. The OS and application programs include multiple instructions and data corresponding to the instruction set. By executing these instructions, the CPU module 142 is able to control other circuits of the touch system 100.

The optional graphics processor (GPU) module 143 is usually configured to handle computations with respect to graphics outputs. The graphics processor module 143 may connect to the touch screen 120 for controlling outputs of the touch screen 120. In some applications, the host 140 may have the CPU module 142 execute the computations with respect to graphics outputs, without dedicated handling of the graphics processor module 143.

The host 140 may comprise components or apparatus not shown in FIG. 1, for example, audio input/output interface, keyboard input interface, mouse input interface, track-ball input interface and/or any other hardware circuits. Persons having ordinary skill in the art should have common knowledge of computer organization and architecture. They can understand the touch system 100 disclosed by the present application is exemplary. Parts regarding to the inventive feature provided by the present application should be referred to the specification and the claim.

Figure 2:
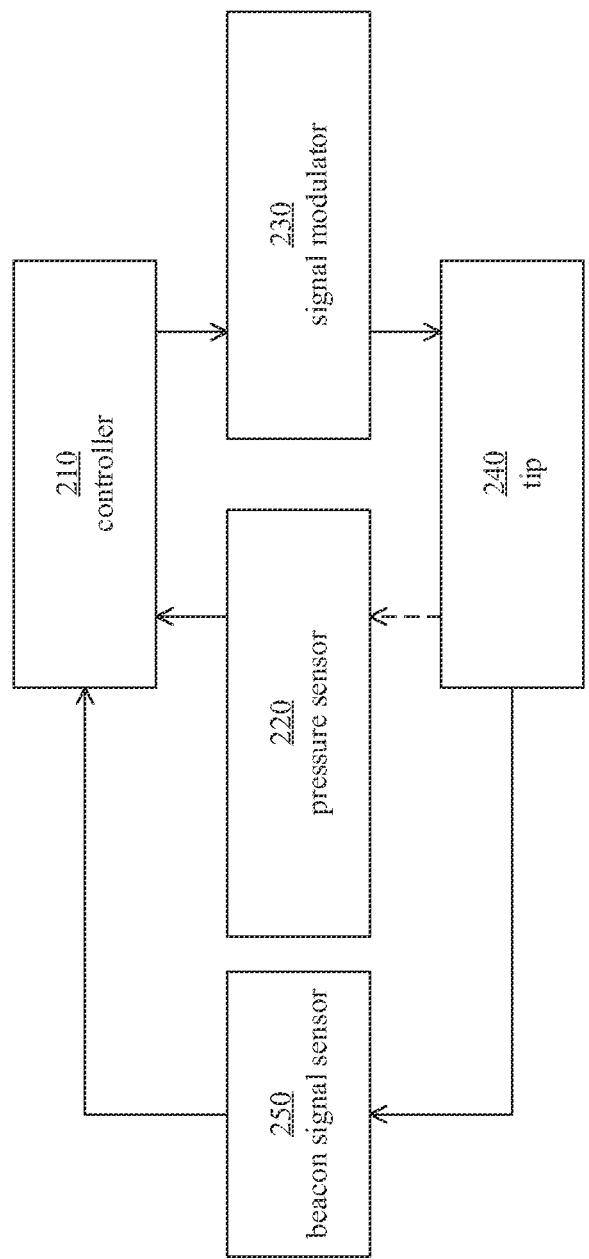
FIG. 2 depicts a block diagram of a stylus in accordance with an embodiment of the present application.

Please refer to FIG. 2, which depicts a block diagram of a stylus 130 in accordance with an embodiment of the present application. A controller 210 is used to control the stylus 130. The controller 210 may be implemented as integrated circuits. It may also include a processor which is configured to execute instructions stored in non-volatile memory to control the stylus 130.

The stylus 130 may comprise a tip 240 and a pressure sensor 220 which is configured to measure the force pressing to the tip 240. In one embodiment, the pressure sensor 220 may be used to measure pressing force to somewhere on a rod of the stylus other than the tip 240 so as that a user of the stylus can input by controlling a holding force to the rod. The pressure sensor 220 may transmits a measured pressure value to the controller 210.

Persons having ordinary skill in the art can understand that the pressure sensor 220 in the embodiment as shown in FIG. 2 is exemplary. Other types of sensors may be applied to the present application as long as it transmits a measured value to the controller 210.

When the controller 210 receives the measured pressure value, it may command a signal modulator 230 to modulate electrical signals to be transmitted according to the pressure value. In one embodiment, the tip 240 is constructed by conductor. The signal modulator 230 may transmits the modulated electrical signals to the tip 240. When the tip 240 approaches or touches the touch panel or screen 120, the electrical signals can be induced by touch electrodes of the touch panel or screen 120 and further propagated to the touch sensitive processing apparatus 110. In an alternative embodiment, the stylus 130 may comprises another electrode near the tip 240, e.g., a ring electrode surrounds the tip 240. The signal modulator 230 may transmits the modulated electrical signals to the electrode other than the tip 240. Similarly, when the electrode approaches or touches the touch panel or screen 120, the electrical signals can be induced by the touch electrodes of the touch panel or screen 120 and further propagated to the touch sensitive processing apparatus 110.

The stylus 130 may further comprise a beacon signal sensor 250 connecting to an electrode at the tip 240 or another electrode near the tip 240. The beacon signal sensor 250 is configured to receive beacon signals transmitted from the touch electrodes of the touch panel or screen 120. After the beacon signals are received, the beacon signal sensor 250 notifies the controller 210 to command the signal modulator 210 to commence the modulation. Since the stylus may not be placed around the touch panel or screen 120 in most time, it saves power energy of the stylus 130 and lengthen work time of the stylus 130 if it transmits electrical signals in response to the receipt of the beacon signals emitted from the touch panel or screen 120.

One of features of the present application is to use a ratio of duty cycles corresponding to two electrical signals to carry the pressure value or any measured value. These two electrical signals include reference signals and modulated signals. In a certain time period, strength of the electrical signals is proportional to its duty cycle. The duty cycle of the reference signals may be set as a fixed value such that the strength of the reference signals may be treated as a reference value. The touch sensitive processing apparatus 110 may measure a ratio of strengths of these two electrical signals to calculate the pressure value or measured value. However, since the touch electrodes of the touch panel or screen 120 may not be distributed evenly, if only the strength of the modulated signals is taken in considerations and no account of the reference signals as a basis, it will bring in errors caused by changing distances between where the tip 240 touches and the nearby touch electrodes. Besides, even when the stylus 130 hovers at the same position, the strength of the modulated signals changes according to the distances between the stylus 130 and the touch panel or screen 120. Without the reference signals as a comparison baseline, errors caused by the changing hover distances of the tip 240 are inevitable.

According to the principles, after the controller 210 receives the measured value, it would command the signal modulator 230 to transmit the reference signals with a fixed duty cycle in a reference signal time period and to transmit the modulated signals with a variable duty cycle in a modulation signal time period. A signal transmission time period is consisted of the reference signal time period and the modulation signal time period. In addition to transmit electrical signals in the signal transmission timer period, the controller 210 may transmit other kinds of electrical signals prior to or after the signal transmission time period for other purposes. For example, a transmission of a preamble code may be used to identify and to positioning the stylus 130 or a transmission of any other kinds of electrical signals may be used to carry other kinds of messages. The present application does not limit what the electrical signals the controller 210 transmits in each time. It is only required that the measured value is transferred during the signal transmission time period.

Please refer to FIG. 3A, which shows a timing sequence of an electrical signal transmission in accordance with an embodiment of the present application. The stylus 139 may continuously proceeds with multiple signal transmission time periods 310 to transmit the measure values. Each of the signal transmission time periods 310 carry different measured values. In other words, the sensor such as the pressure sensor 220 may gather a new measured value during each of the signal transmission time period and transmits the gather measured value during next signal transmission time period.

Each signal transmission time period 310 comprises a reference signal time period 312 and a modulation signal time period 314. Although it shows that the reference signal timer period 312 is prior to the modulation signal time period as shown in FIG. 3A, the present application does not limit the sequence of these two time periods. Besides, although it does not show any turnaround period between the reference signal time period 312 and the modulation signal time period 314 as shown in FIG. 3A, the present application does not limit that the two time periods are immediately adjacent or there is any other time period inserted in between of these two time periods.

In one embodiment, in order to make works of the touch sensitive processing apparatus 110 more convenient, amplitudes of electrical signals in the reference signal time period 312 and the modulation signal time period 314 are identical. However, the present application does not limit that these amplitudes should be the same. A first duty cycle DC1 of the reference signal time period 312 is fixed. And a second duty cycle DC2 of the modulation signal time period 314 is changed according to the measured value being carried. The measured value being carried may be corresponding to a ratio R between the first duty cycle DC1 and the second duty cycle DC2. The ratio R may be one of following: DC1/DC2, DC2/DC1, DC1/(DC1+DC2), DC2/(DC1+DC2), (DC1−DC2)/DC2, (DC1−DC2)/DC1, etc. Person having ordinary skill in the art can understand the denominator is not zero and the ratio may be calculated in other formulas. Because the ratio R is corresponding to known measured values and the first duty cycle DC1 is also a fixed and predetermined value, the controller 210 can calculate the second duty cycle DC2 according to the ratio R and the first duty cycle DC1. Next, the controller 210 may command the signal modulator 230 to transmits modulated signals with the second duty cycle DC2.

Please refer to FIG. 3B, which shows a timing sequence of an electrical signal transmission in accordance with an embodiment of the present application. Comparing with the embodiment as shown in FIG. 3A, the signal transmission time periods 310 is not continuously. A signal transmission time period, a signal reception time period or a blanking time period may be arranged in between two of the signal transmission time periods 310.

Please refer to FIG. 3C, which shows a timing sequence of an electrical signal transmission in accordance with an embodiment of the present application. Comparing with the embodiment as shown in FIG. 3B, after receiving beacon signals emitted from the touch panel or screen 120, the stylus 130 as shown in FIG. 3C arranges a corresponding signal transmission time period 310 in order to transmit electrical signals.

Please refer to FIG. 4A, which shows a timing sequence of an electrical signal transmission in accordance with an embodiment of the present application. Three timing sequences are included in FIG. 4A. The top sequence shows an example of a reference signal time period 312. Four square waves are found during the reference signal time period 312. The first duty cycle DC1 is 50%. Persons having ordinary skill in the art can understand that the square waves as shown in FIG. 4A may be substitute as sine waves. Besides, the first duty cycle DC1 may be set to other proportion.

The middle sequence as shown in FIG. 4A shows a maximum of the second duty cycle DC2 in the modulation signal time period 314. And the bottom sequence as shown in FIG. 4A shows a minimum of the second duty cycle DC2 in the modulation time period 314. Assuming the ratio R is corresponding to DC2/DC1 in the embodiment as shown in FIG. 4A. In case the maximum of the second duty cycle is 50%, the ratio R of DC2/DC1 is 1 or 100%. In case the minimum of the second duty cycle is 0%, the ratio R of DC2/DC1 is 0 or 0%. When the ratio R is calculated to two decimal places, the ratio R is corresponding to a range in between 0~100. When the ratio R is calculated to three decimal places, the ratio R is corresponding to a range in between 0~1000.

In one embodiment, the touch sensitive processing apparatus 110 does not measure the second duty cycle DC2 of the modulation signal time period 314. Instead, it can measure signal strengths of the reference signal time period 312 and the modulation signal time period 314 to calculate the ratio R. For example, the sensing circuit module 113 measures the signal strength of the reference signal time period 312 to get a first signal strength value. A signal strength value is corresponding to a sum of areas corresponding to the line. The sensing circuit module 113 measures the signal strength of the middle reference signal time period 314 as shown in FIG. 4A to get a maximum of second signal strength value. Since the ratio r of the second signal strength value and the first signal strength value equals to 1, it is equivalent to the ratio R (DC2/DC1). The sensing circuit module 113 measures the signal strength of the bottom reference signal time period 314 as shown in FIG. 4A to get a minimum of second signal strength value which is 0. Since the ratio r of the second signal strength value and the first signal strength value equals to 0, it is equivalent to the ratio R (DC2/DC1). When the ratio r is calculated to two decimal places, the ratio r is corresponding to a range in between 0~100. When the ratio r is calculated to three decimal places, the ratio r is corresponding to a range in between 0~1000. Because the ratio r of the signal strengths is equivalent to the ratio R of the duty cycles, the present application does not limit which ratio value to be measured.

Figure 4B:
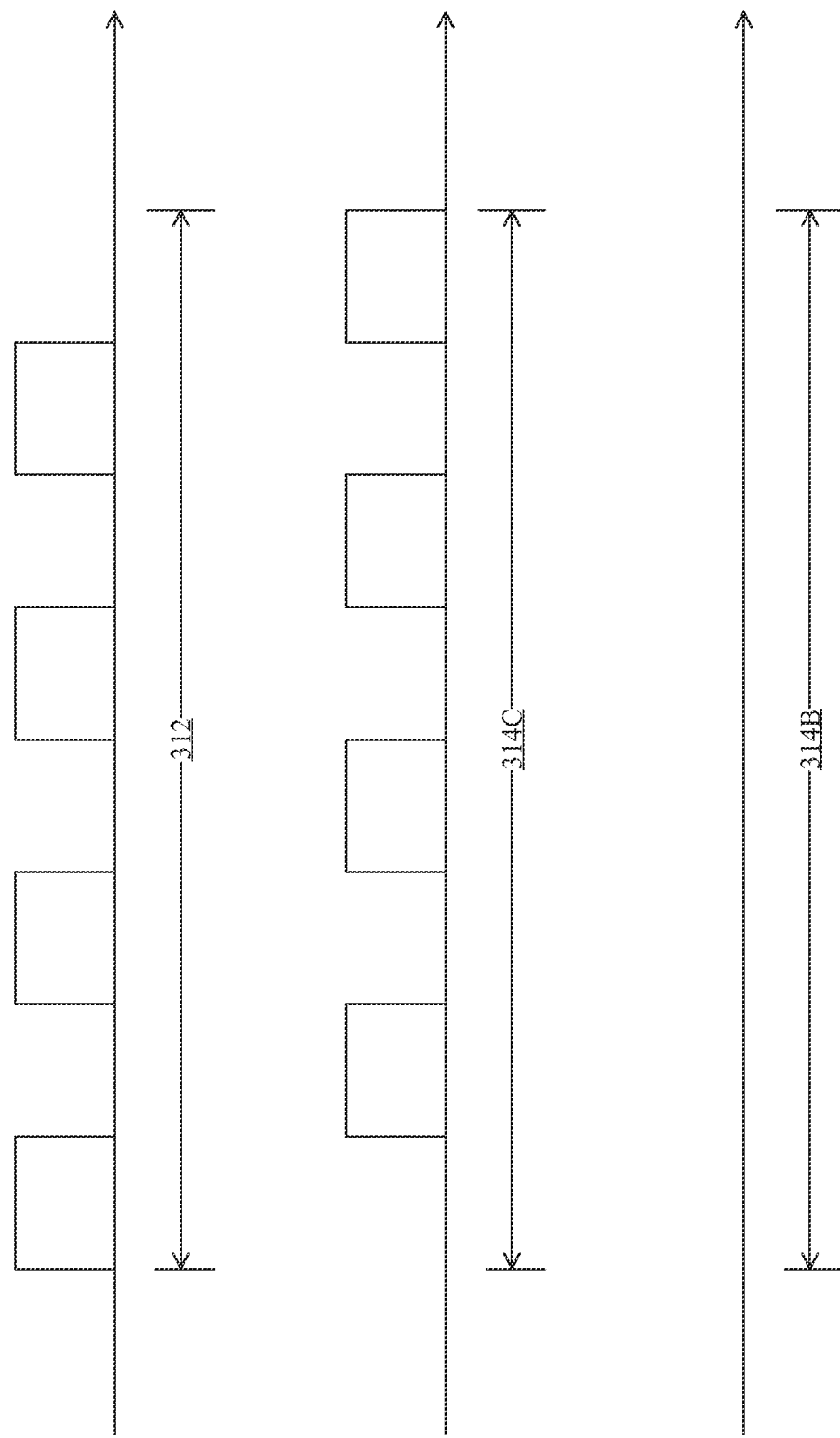
FIG. 4B shows a timing sequence of an electrical signal transmission in accordance with an embodiment of the present application.

Please refer to FIG. 4B, which shows a timing sequence of an electrical signal transmission in accordance with another embodiment of the present application. Similar to the embodiment as shown in FIG. 4A, three time sequences are shown in FIG. 4B. The top time sequence is an example of the reference signal time period 312. The middle time sequence is an example of the modulation signal period 314C with a maximum second duty cycle. The bottom time sequence is an example of the modulation signal period 314B with a minimum second duty cycle. Comparing with the modulation signal period 314A as shown in FIG. 4A, the phase of square waves in the modulation signal time period 314C as shown in FIG. 4B is delayed about 180 degrees. However, the signal strengths of the modulation signal time periods 314A and 314C are identical. Even the phase is changed, the touch sensitive processing apparatus 130 can still measure the identical maximum of the second signal strength value with regard to the modulation signal time period 314C.

Figure 4C:
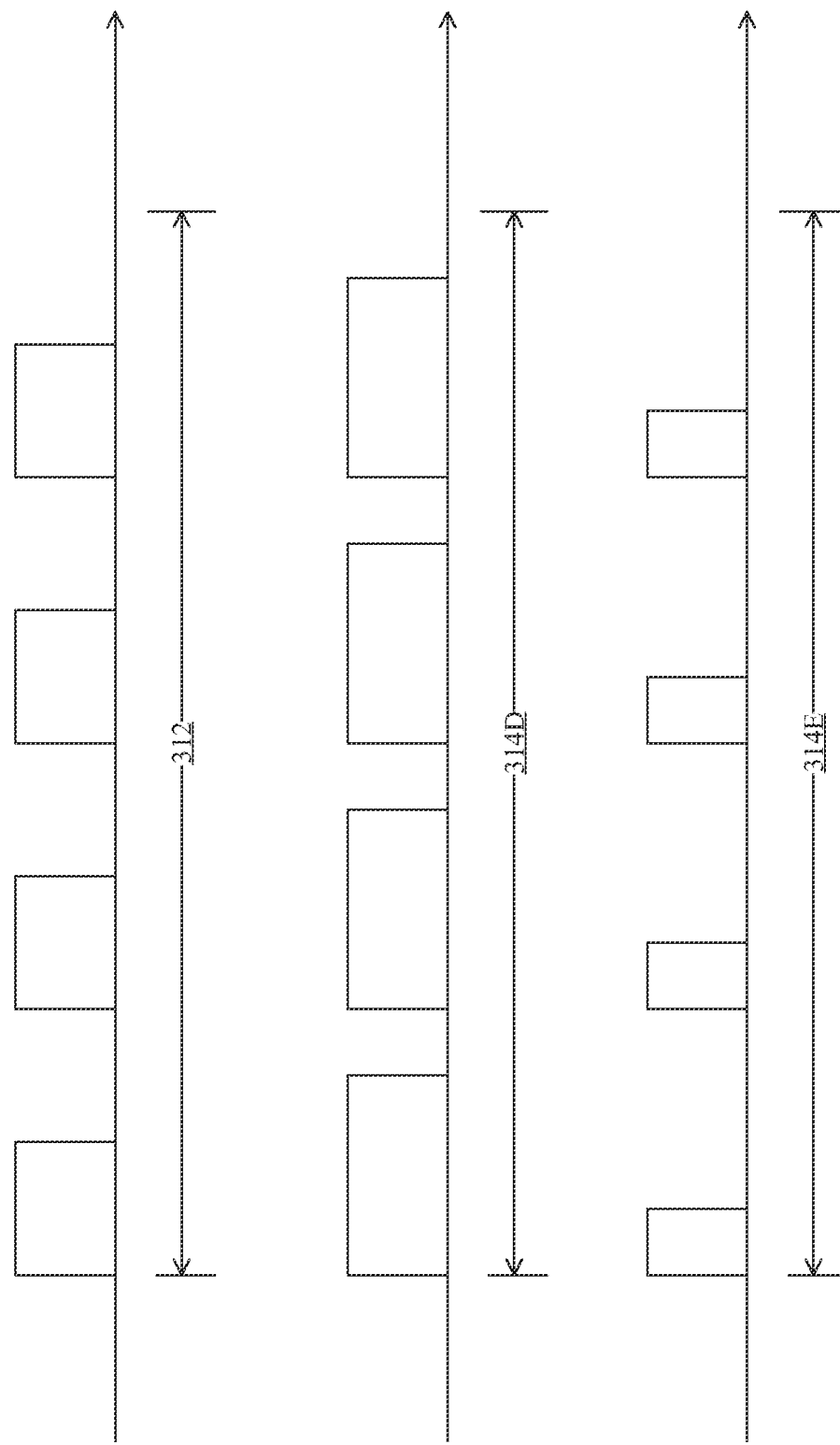
FIG. 4C shows a timing sequence of an electrical signal transmission in accordance with an embodiment of the present application.

Please refer to FIG. 4C, which shows a timing sequence of an electrical signal transmission in accordance with an alternative embodiment of the present application. Similar to the embodiment as shown in FIG. 4A, three time sequences are shown in FIG. 4C. The top time sequence is an example of the reference signal time period 312. The middle time sequence is an example of the modulation signal period 314D with a maximum second duty cycle. The bottom time sequence is an example of the modulation signal period 314E with a minimum second duty cycle. The maximum duty cycle corresponding to the modulation signal time period 314D is 75%. The minimum duty cycle corresponding to the modulation signal time period 314E is 25%. In other words, a maximum of the ratio r of these two signal strengths is 75%/50% and a minimum of the ratio r of these two signal strengths is 25%/50%. The ratio r is in between 1.5 and 0.5. Persons having ordinary skill in the art can understand that a linear transformation function may be used to convert the ratio r to the ratio R so as that the range can be in between 0%~100%. For example, R=r−0.5.

Please refer to FIG. 4D, which shows a timing sequence of an electrical signal transmission in accordance with an alternative embodiment of the present application. Similar to the embodiment as shown in FIG. 4A, three time sequences are shown in FIG. 4D. The top time sequence is an example of the reference signal time period 312D. The middle time sequence is an example of the modulation signal period 314E with a maximum second duty cycle. The bottom time sequence is an example of the modulation signal period 314F with a minimum second duty cycle. There are four square waves in the reference signal time period 312. Each of the square waves has a first duty cycle as 50%. There is only one square wave in the modulation reference signal 312D with a first duty cycle as 50%. No matter there are four square waves or one square wave, the signal strengths of the reference signal time periods 312 and 312D are the same because the duty cycles are the same. Similarly, the second duty cycle of the single square wave in the modulation signal time period 314F is as the same as the second duty cycles of the four square waves in the modulation signal time periods 314A and 314B. Hence, the signal strengths of the modulation signal time periods 314A, 314B and 314F should be the same.

Figure 5A:
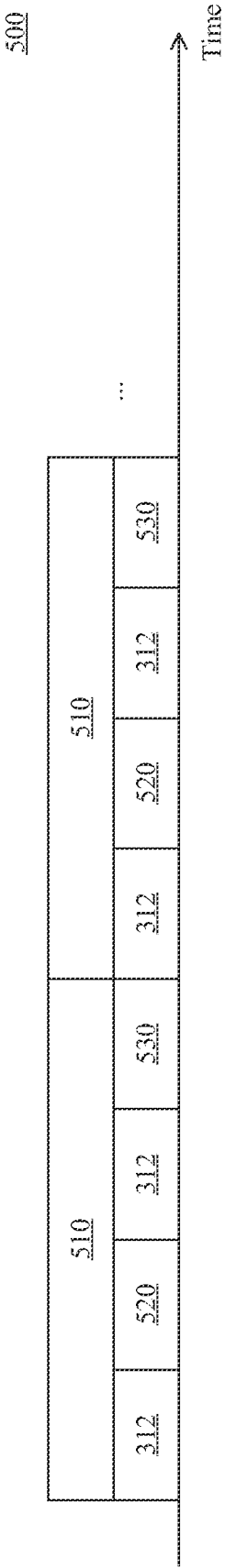
FIG. 5A shows a timing sequence of an electrical signal transmission in accordance with an embodiment of the present application.

We can learn from the embodiment as shown in FIG. 4D, in additional to the ratio R of two duty cycles, the signal modulator 230 of the stylus 130 may control number of waves in the reference signal time period 312 or the modulation signal time period 314 to carry more information. Please refer to FIG. 5A, which shows a timing sequence of an electrical signal transmission in accordance with an embodiment of the present application. The signal transmission time period 510 consists of two time periods, merely. However, the signal transmission time period 510 as shown in FIG. 5A consists of four time periods. They are a first reference time period 312, a first modulation time period 520, a second reference time period 312 and a second modulation time period 530. The sequence of these four time periods may be exchanged freely. In the embodiment, in order to measure signal strengths conveniently, the lengths of these four time periods are the same. The first and the second reference signal time periods 312 may transmit electrical signals with identical duty cycle, which may be predetermined. However, persons having ordinary skill in the art can understand that the duty cycles of the electrical signals transmitted during the first and the second reference signal time periods 312 may be different. The duty cycles of the first and the second modulation signal time periods 520 and 530 may be different. Besides, the number of waves transmitted during the first and the second modulation signal time periods 520 and 530 may be different.

In one embodiment, the duty cycles and the number of waves of the electrical signals transmitted during the first and the second modulation signal time periods 520 and 530 may be modulated in order to carry sensed measure values. In such way, the resolution of measurement of the duty cycles may be decreased. In case in order to transmit a three-digit measured value, two of the three digits can be carried by modulating the duty cycles and the rest one digit can be carried by modulating the number of waves. For example, in case the number 243, the first two digits, 2 and 4, and the last digit 3 are modulated, respectively. First, by adjusting the duty cycles, it makes the ratio r1 between the signal strengths of the first modulation signal time period 520 and the first reference signal time period 312 represents an integral number 24. Next, by adjusting the duty cycles, it makes the ratio r2 between the signal strength of the second modulation signal time period 520 and the second reference signal time period 312 represents a sum of the ratio r1 and 1, i.e., r2=r1+1. In this case, the ratio r2 is 25. Following that, it makes the number of waves w2 during the second modulation signal time period 530 are 3 for representation of the last digit. And it makes that the number of waves w1 during the first modulation signal time period 520 is a difference between 10 and the number of waves w2. In this case, the number of waves w1 is 7.

When receiving the electrical signals transmitted during the signal transmission time period 510, the touch sensitive processing apparatus 130 can detect the aforementioned ratios r1 and r2. They are 24 and 25, respectively. It can also detect that the number of waves w1 is 7 and the number of waves w2 is 3. Next, it brings the four numbers, i.e., the number of waves w1 transmitted in the first modulation signal time period 520, the number of waves w2 transmitted in the second modulation signal time period 530 and the two ratios r1 and r2 into Formula 1 to get a number r as 24.3, where the decimal place of the number r represents the last digit 3 and the integral part of the number r represents the first two digits 24.

$$r = \frac{w1 \times r1}{(w1+w2)} + \frac{w2 \times r2}{(w1+w2)} = \frac{(w1 \times r1) + (w2 \times r2)}{(w1+w2)} \quad \text{(Formula 1)}$$

If it is desired to transmit a measured value with more digits, identical modulation can be used. In an alternative embodiment, in case it is desired to transmit a number 2433, the ratios r1 and r2 may be set as 24 and 25, respectively. And the number of waves w1 is set 2 and the number of waves w2 is set 1. When these four numbers are brought into the Formula 1, a number r, 2433, is calculated, where the decimal places of the number r present the third and the fourth digits 3 and 3, respectively, and the integral part of the number r represents the first two digits 24.

The stylus may use look up tables or other ways to determine the numbers of waves w1 and w2. For example, in case for carrying a one-digit value, a sum of the numbers of waves w1 and w2 may be 10. Alternatively, the numbers of waves w1 and w2 may be mutually prime. It means that the greatest common factors of these numbers of waves w1 and w2 is 1. In case that the numbers of waves w1 and w2 are not co-prime, they can be divided by their greatest common factors to get two new numbers w1 and w2 which are mutual prime numbers. In an example, in case for carrying a two-digit value, a sum of the numbers w1 and w2 can be 100. So on and so forth.

Figure 5B:
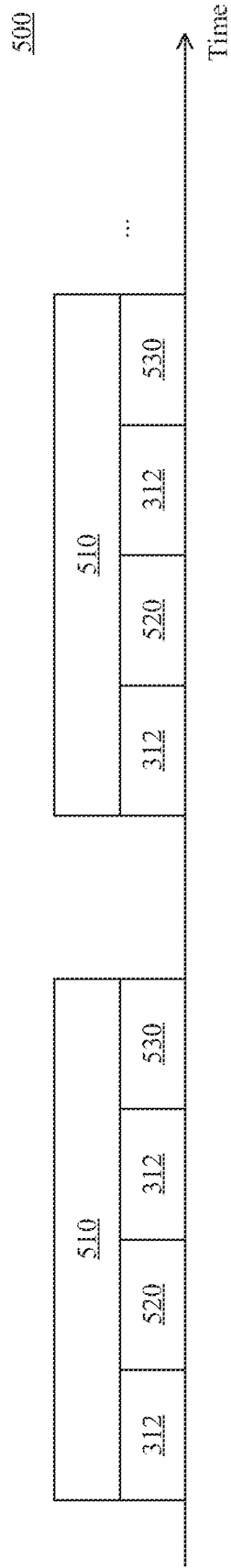
FIG. 5B shows a timing sequence of an electrical signal transmission in accordance with an embodiment of the present application.
Figure 5C:
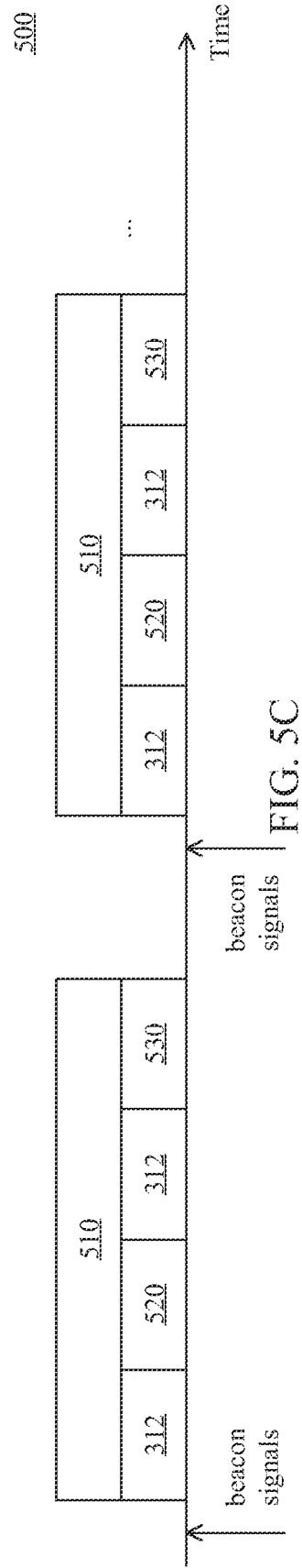
FIG. 5C shows a timing sequence of an electrical signal transmission in accordance with an embodiment of the present application.

Please refer to FIG. 5B, which shows a timing sequence of an electrical signal transmission in accordance with another embodiment of the present application. Comparing with the embodiment as shown in FIG. 5A, there is a turnaround blanking time period or a time period for transmitting other electrical signals in between the two signal transmission time periods 510. The present application does not limit that the signal transmission time periods 510 are arranged continuously.

Please refer to FIG. 5B, which shows a timing sequence of an electrical signal transmission in accordance with another embodiment of the present application. Comparing with the embodiment as shown in FIG. 5B, the signal transmission time period 510 is arranged after the beacon signals transmitted from the touch panel or screen 120 are detected in order to save useless energy power of the electrical signals transmitted by the stylus 130 in case that it is far from the touch panel or screen 120.

Figures 6A, 6B, 6C:
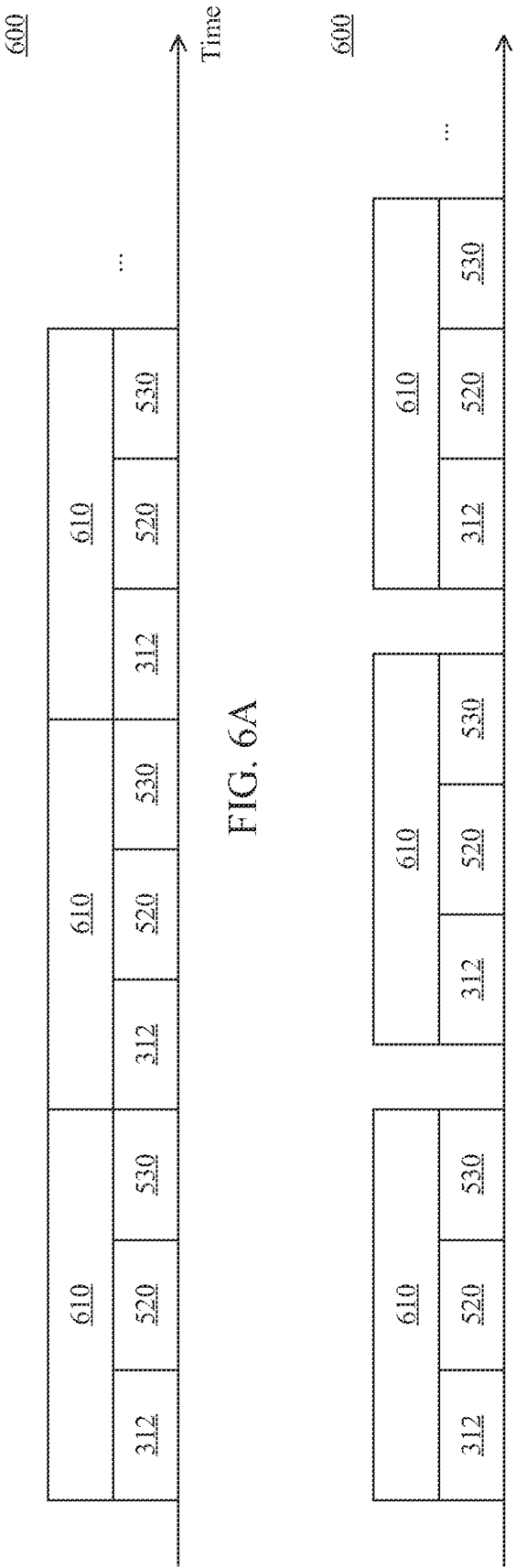
FIG. 6A shows a timing sequence of an electrical signal transmission in accordance with an embodiment of the present application.
FIG. 6B shows a timing sequence of an electrical signal transmission in accordance with an embodiment of the present application.
FIG. 6C shows a timing sequence of an electrical signal transmission in accordance with an embodiment of the present application.

Please refer to FIG. 6A, which shows a timing sequence of an electrical signal transmission in accordance with an embodiment of the present application. Comparing with the embodiment as shown in FIG. 5A, only one reference signal time period 312 is included in the signal transmission time period 610 as shown in FIG. 6A. Therefore, the ratio r1 is a proportion corresponding to the signal strength of the first modulation signal time period 520 and the signal strength of the reference signal time period 312. The ratio r2 is a proportion corresponding to the signal strength of the second modulation signal time period 530 and the signal strength of the reference signal time period 312.

Please refer to FIG. 6B, which shows a timing sequence of an electrical signal transmission in accordance with another embodiment of the present application. Comparing with the embodiment as shown in FIG. 6A, there is a turnaround blanking time period or a time period for transmitting other electrical signals in between the two signal transmission time periods 610. The present application does not limit that the signal transmission time periods 610 are arranged continuously.

Please refer to FIG. 6C, which shows a timing sequence of an electrical signal transmission in accordance with another embodiment of the present application. Comparing with the embodiment as shown in FIG. 6B, the signal transmission time period 610 is arranged after the beacon signals transmitted from the touch panel or screen 120 are detected in order to save useless energy power of the electrical signals transmitted by the stylus 130 in case that it is far from the touch panel or screen 120.

Figure 7:
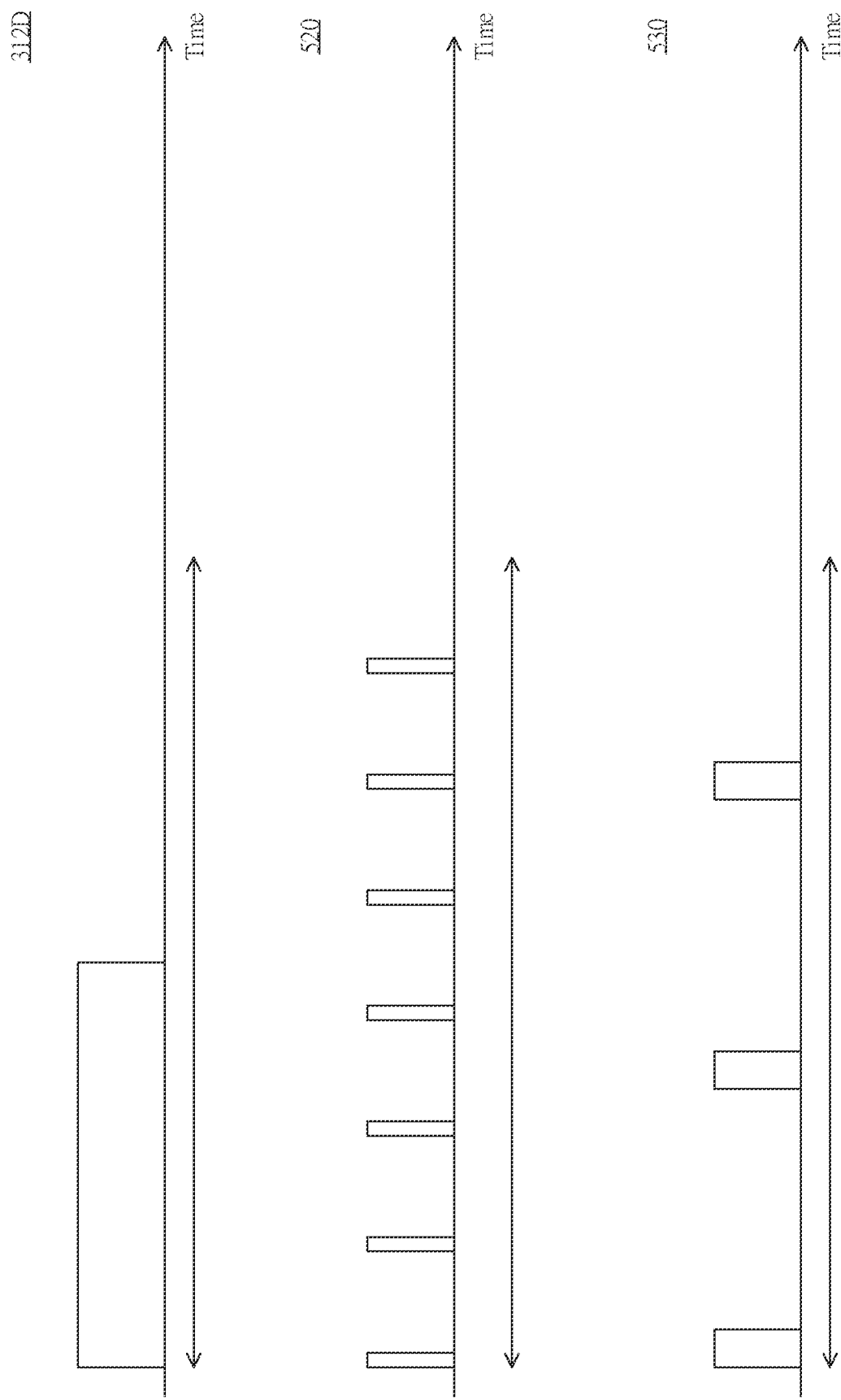
FIG. 7 shows a timing sequence of an electrical signal transmission in accordance with an embodiment of the present application.

Please refer to FIG. 7, which shows a timing sequence of an electrical signal transmission in accordance with an embodiment of the present application. Three time periods are shown in FIG. 7. The top one is the reference signal time period 312D. The middle one is the first modulation signal time period 520. And the bottom one is the second modulation signal time period 530. In the embodiment as shown in FIG. 7, the stylus 130 transmits 7 waves during the first modulation signal time period 520. A ratio R1 of the duty cycle of the seven waves and the duty cycle of the reference signal time period 312D is 24%. The stylus 130 transmits 3 waves during the second modulation signal time period 530. A ratio R2 of the duty cycle of the three waves and the duty cycle of the reference signal time period 312D is 25%. Hence, the ratio r1 is set as 24%, the ratio r2 is set as 25%, the number of waves w1 is set as 7 and the number of waves w2 is set as 3. Brining them into the Formula 1, the result is calculated as 24.3. Hence, the touch sensitive processing apparatus 110 can derive that the three-digit value which the stylus 130 intends to transmit is 243.

Figure 8:
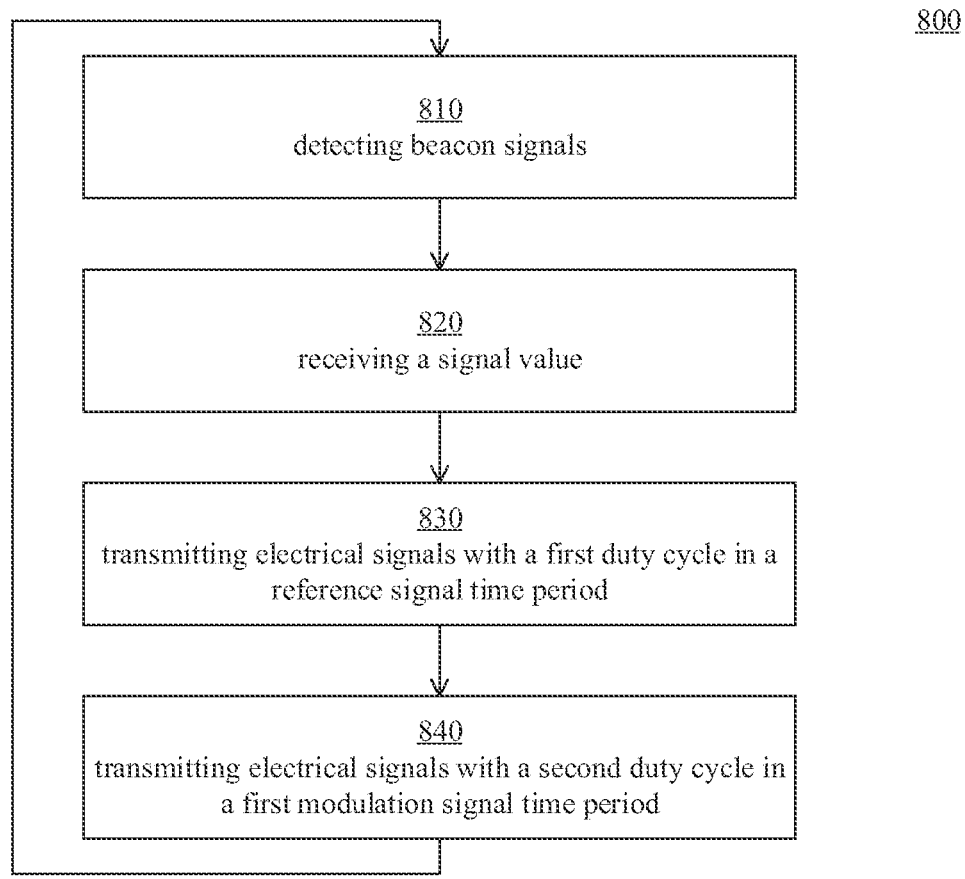
FIG. 8 depicts a flowchart diagram of a method for transmitting a signal value in accordance with an embodiment of the present application.

Please refer to FIG. 8, which depicts a flowchart diagram of a method 800 for transmitting a signal value in accordance with an embodiment of the present application. The method 800 is applicable to the stylus 130 as shown in FIGS. 1 and 2. In one embodiment, the flow begins at an optional step 810. Alternatively, the flow begins at step 820.

Optional step 810: detecting beacon signals. For example, via an electrode at the tip 240 of the stylus 130, the beacon signal detector 250 may detect beacon signals emitted from the touch panel or screen 120. Next, the flow may proceed to step 820. However, the present application does not limit the execution sequence of the steps 810 and 820. The steps 810 and 820 can be performed in any order or simultaneously. In one embodiment, it is required that the beacon signals have to be detected at step 810, the method 800 can perform steps 830 and 840.

Step 820: receiving a signal value. The signal value may be generated by a measurement of physical phenomena by a sensor. The signal value is fallen in a range and can be represented in three digits. In the embodiment as shown in FIG. 2, the pressure sensor 220 measures the pressure on the tip 240 and passes the measured pressure signal value to the controller 210. The range of the measured signal value may be 1~1024, 1~256 or 1~16, etc. Next, the flow proceeds to step 830. However, the present application does not limit the execution order of step 830 and 840.

Step 830: transmitting electrical signals with a first duty cycle in a reference signal time period.

Step 840: transmitting electrical signals with a second duty cycle in a modulation signal time period.

A first ratio corresponding to the second duty cycle and the first duty cycle represents the signal value. The first duty cycle may be a predetermined fixed value. The electrical signals with the second duty cycle is modulated according to the signal value. In one embodiment, the lengths of the reference signal time period and the modulation signal time period are the same. The maximum amplitudes of the electrical signals of the reference signal time period and the modulation signal time period are the same. However, persons having ordinary skill in the art can understand the lengths of the reference signal time period and the modulation signal time period may be different. And the maximum amplitudes of the electrical signals of the reference signal time period and the modulation signal time period may be different. After the steps 830 and 840 are executed, the flow may return to the steps 810 or 820.

Figure 9:
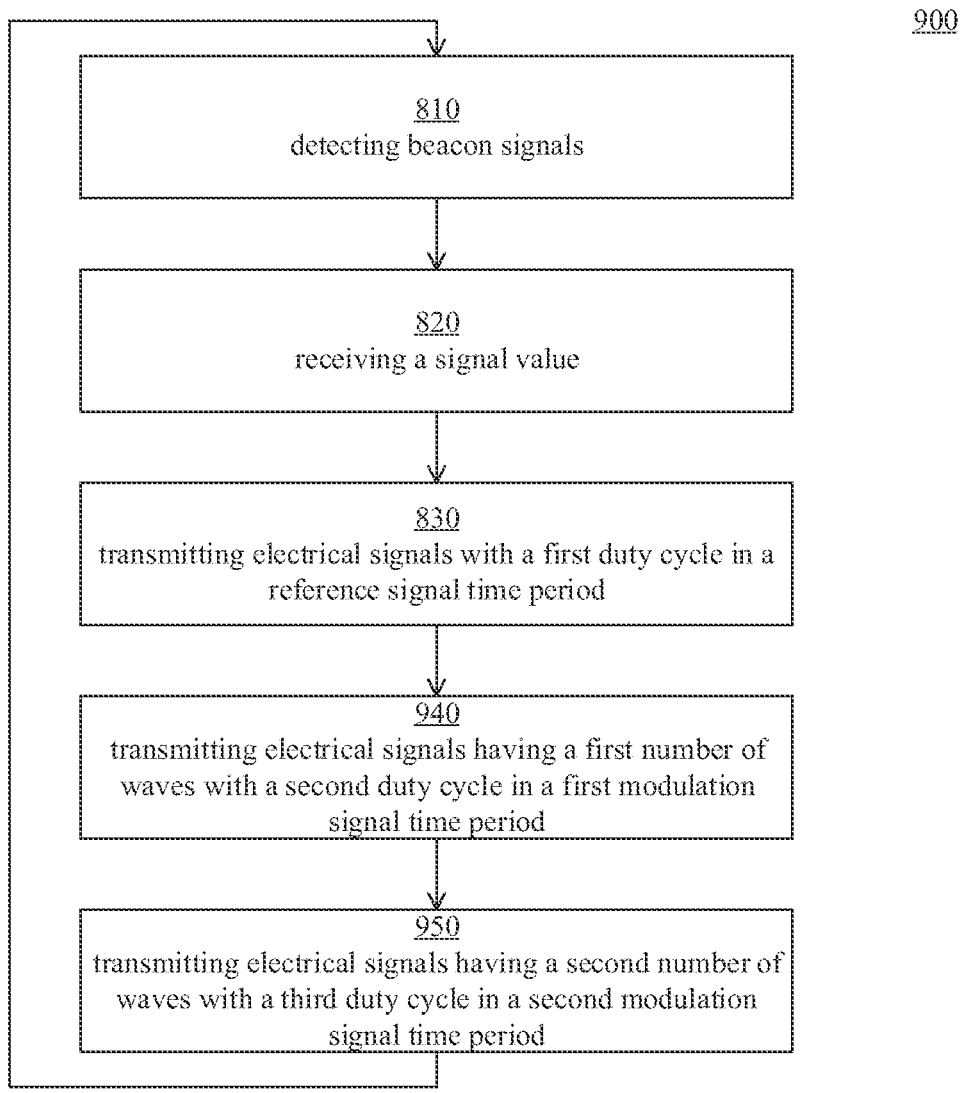
FIG. 9 depicts a flowchart diagram of a method for transmitting a signal value in accordance with an embodiment of the present application.

Please refer to FIG. 9, which depicts a flowchart diagram of a method 900 for transmitting a signal value in accordance with an embodiment of the present application. The method 900 is applicable to the stylus 130 as shown in FIGS. 1 and 2. In one embodiment, the flow begins at an optional step 810. In one embodiment, it is required that the beacon signals have to be detected at step 810, the method 900 can perform steps 830, 940 and 950. Alternatively, the method 900 may begins at step 820. After the steps 810 and 820 are executed, the flow may proceed to step 830. However, the present application does not limit the execution order of the steps 830, 940 and 950.

Step 940: transmitting electrical signals including a first number of waves with a second duty cycle during a first modulation signal time period.

Step 950: transmitting electrical signals including a second number of waves with a third duty cycle during a second modulation signal time period.

The signal value is corresponding to a function of the first ratio, a second ratio, the first number of waves and the second number of waves. The second ratio is corresponding to the third duty cycle and the first duty cycle. In one embodiment, the greatest common factors of the first and the second numbers of waves is 1. The value of function is corresponding to the calculation result of the Formula 1.

Figure 10:
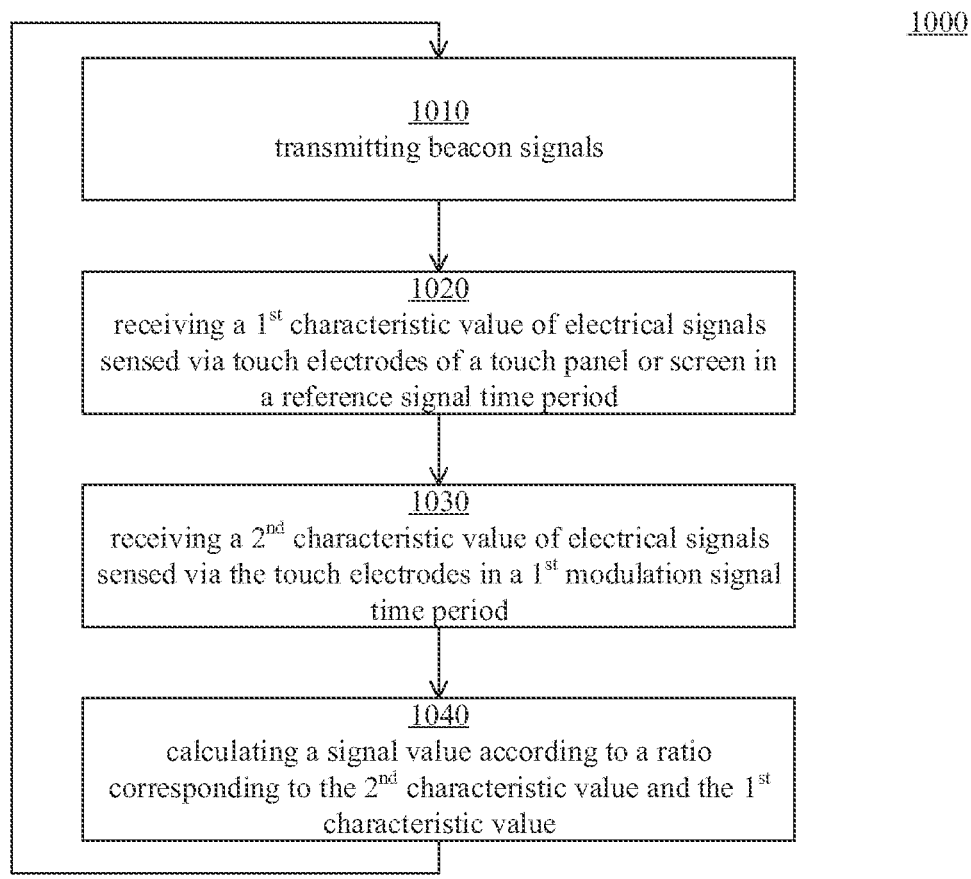
FIG. 10 illustrates a flow chart diagram of a touch sensitive processing method for receiving a signal value in accordance with an embodiment of the present application.

Please refer to FIG. 10, which illustrates a flow chart diagram of a touch sensitive processing method 1000 for receiving a signal value in accordance with an embodiment of the present application. The touch sensitive processing method 1000 is applicable to the touch sensitive processing apparatus as shown in FIG. 1. The touch sensitive processing method 1000 may be implemented by execution of instructions stored in a non-volatile memory by the processor module 114. The touch sensitive processing method 1000 may begin at optional step 1010 or at step 1020.

Optional step 1010: transmitting beacon signals. The beacon signals may be transmitted from multiple touch electrodes of a touch panel or screen 120. Or it may be transmitted from any other antenna or electrode. Next the flow may proceed to steps 1020 or 1030. The present application does not limit the execution order of steps 1020 and 1030.

Step 1020: receiving a first characteristic value of electrical signals transmitted by a transmitter via multiple touch electrodes of a touch panel or screen 120 during a reference signal time period. The first characteristic value may be a value of duty cycle or a sum of signal strength.

Step 1030: receiving a second characteristic value of the electrical signals via the touch electrodes during a first modulation signal time period. In case that the first characteristic value is a duty cycle value, the second characteristic value is also a duty cycle value. In case that the first characteristic value is a sum of signal strength value, the second characteristic value is also a sum of signal strength value.

Step 1040: calculating a signal value carried by the electrical signals according to a ratio corresponding to the second characteristic value and the first characteristic value. Next, the method 1000 may return to the optional step 1010, step 1020 or step 1030.

Figure 11:
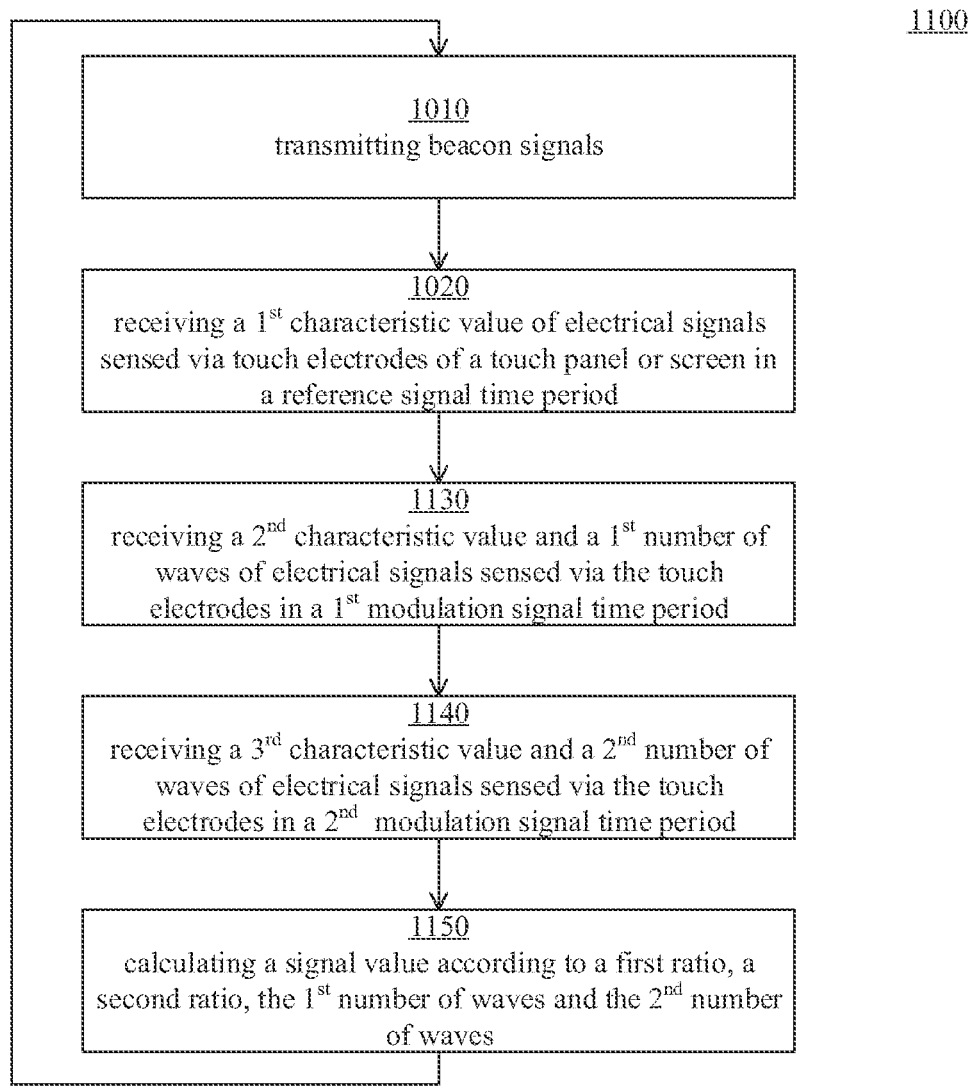
FIG. 11 illustrates a flow chart diagram of a touch sensitive processing method for receiving a signal value in accordance with an embodiment of the present application.

Please refer to FIG. 11, which illustrates a flow chart diagram of a touch sensitive processing method 1100 for receiving a signal value in accordance with an embodiment of the present application. The touch sensitive processing method 1100 is applicable to the touch sensitive processing apparatus as shown in FIG. 1. The touch sensitive processing method 1100 may be implemented by execution of instructions stored in a non-volatile memory by the processor module 114. The touch sensitive processing method 1100 may begin at optional step 1010 or at step 1020. The present application does not limit the execution order of the steps 1020, 1130 and 1140.

Step 1130: receiving the second characteristic value and a first number of waves of the electrical signals via the multiple touch electrodes during a first modulation signal time period. In case that the first characteristic value is a duty cycle value, the second characteristic value is also a duty cycle value. In case that the first characteristic value is a sum of signal strength value, the second characteristic value is also a sum of signal strength value.

Step 1140: receiving a third characteristic value and a second number of waves of the electrical signals via the multiple touch electrodes during a second modulation signal time period. In case that the first characteristic value is a duty cycle value, the third characteristic value is also a duty cycle value. In case that the first characteristic value is a sum of signal strength value, the third characteristic value is also a sum of signal strength value.

Step 1150: calculating a signal value carried by the electrical signals according to a function of a first ratio corresponding to the second characteristic value and the first characteristic value, a second ratio corresponding to the third characteristic value and the first characteristic value, the first number of waves and the second number of waves. In one embodiment, the greatest common factors of the first and the second numbers of waves is 1. The value of the function is corresponding to the calculated result of the Formula 1.

According to an embodiment of the present application, it provides a transmitter for transmitting a signal value. The transmitter comprising: a signal modulator for transmitting electrical signals via an electrode, wherein the electrical signals carry a message representing a signal value; and a controller, coupled to the signal modulator, configured for having the signal modulator transmitting the electrical signals with a first duty cycle in a reference signal time period and transmitting the electrical signals with a second duty cycle in a modulation signal time period, wherein a first ratio corresponding to the second duty cycle and the first duty cycle is corresponding to the signal value, wherein the lengths of the reference signal time period and the modulation signal time period are the same, and wherein the maximum amplitudes of the electrical signals during the reference signal time period and the modulation signal time period are the same.

Preferably, in order to simplify designs of the transmitter and the touch sensitive processing apparatus, the first duty cycle is a predetermined fixed value, the transmitter is configured for modulating the electrical signals with the second duty cycle according to the signal value.

Preferably, in order to transmit the signal value measured by a sensor onboard the transmitter, the transmitter further comprises a sensor for measuring physical phenomena to generate the signal value, where the signal value is fallen in a range which is represented by three or more digits.

Preferably, in order to transmit a pressure value of a tip of a stylus is use, the transmitter is a stylus, the electrode is a tip electrode of the stylus, the sensor is configured for measuring the pressure force to the tip electrode, the signal value is a pressure value generated by the sensor.

Preferably, in order to prevent transmitting useless electrical signals where the stylus is far away from the touch panel or screen, the transmitter further comprises a beacon signal sensor, which is coupled to the controller, configured for detecting beacon signals and notifying the controller, wherein the controller having the signal modulator transmitting the electrical signals with the first duty cycle in the reference signal time period and transmitting the electrical signals with the second duty cycle in the modulation signal time period in response to receiving of the notification from the beacon signal sensor.

Preferably, in order to synchronize the time periods between the stylus and the touch sensitive processing apparatus, the transmitter is a stylus, the electrode is a tip electrode of the stylus, the beacon signal detector detects the beacon signals emitted from a touch panel via the tip electrode.

Preferably, in order to carry more information in the same time using a second modulation, the controller is further configured for having the signal modulator transmitting the electrical signals with a third duty cycle in another modulation signal time period, wherein the electrical signals transmitted during the modulation signal time period having a first number of waves, wherein the electrical signals transmitted during the another modulation signal time period having a second number of waves, wherein the signal value is corresponding to a function of the first ratio, a second ratio, the first number of waves and the second number of waves, where the second ratio is corresponding to the third duty cycle and the first duty cycle.

Preferably, in order to save power by reducing number of waves, wherein the greatest common factor of the first number of waves and the second number of waves is 1, the function is corresponding to the result of the Formula 1.

According to an embodiment of the present application, it provides a method for transmitting a signal value. The method comprising: transmitting electrical signals with a first duty cycle via an electrode during a reference signal time period, wherein the electrical signals carry a message representing the signal value; and transmitting the electrical signals with a second duty cycle during a modulation signal time period, wherein a first ratio corresponding to the second duty cycle and the first duty cycle is corresponding to the signal value, wherein the lengths of the reference signal time period and the modulation signal time period are the same, wherein the maximum amplitudes of the electrical signals during the reference signal time period and the modulation signal time period are the same.

Preferably, in order to simplify designs of the transmitter and the touch sensitive processing apparatus, the first duty cycle is a predetermined fixed value, the electrical signals with the second duty cycle are modulated according to the signal value.

Preferably, in order to transmit the signal value measured by a sensor onboard the transmitter, the signal value is generated by a sensor which measures physical phenomena, where the signal value is fallen in a range which is represented by three or more digits.

Preferably, in order to transmit a pressure value of a tip of a stylus is use, the electrode is a tip electrode of a stylus, the sensor is configured for measuring the pressure force to the tip electrode, the signal value is a pressure value generated by the sensor.

Preferably, in order to prevent transmitting useless electrical signals where the stylus is far away from the touch panel or screen, the method further comprises detecting beacon signals and transmitting the electrical signals with the first duty cycle in the reference signal time period and transmitting the electrical signals with the second duty cycle in the modulation signal time period in response to the beacon signals are detected.

Preferably, in order to synchronize the time periods between the stylus and the touch sensitive processing apparatus, the electrode is a tip electrode of a stylus, the detecting beacon signals step includes detecting the beacon signals emitted from a touch panel via the tip electrode.

Preferably, in order to carry more information in the same time using a second modulation, the method further comprises transmitting the electrical signals with a third duty cycle in another modulation signal time period, wherein the electrical signals transmitted during the modulation signal time period having a first number of waves, wherein the electrical signals transmitted during the another modulation signal time period having a second number of waves, wherein the signal value is corresponding to a function of the first ratio, a second ratio, the first number of waves and the second number of waves, where the second ratio is corresponding to the third duty cycle and the first duty cycle.

Preferably, in order to save power by reducing number of waves, wherein the greatest common factor of the first number of waves and the second number of waves is 1, the function is corresponding to the result of the Formula 1.

According to an embodiment of the present application, it provides a touch sensitive processing apparatus for receiving a signal value. The touch sensitive processing apparatus comprising: a sensing circuit module for connecting multiple touch electrodes of a touch panel in order to detect electrical signals emitted from a transmitter, wherein the electrical signals carry a message representing a signal value; and a processor module, coupled to the sensing circuit module, configured for executing instructions stored in non-volatile memory for realize following: having the sensing circuit module sensing a first characteristic value of the electrical signals received in a reference signal time period; having the sensing circuit module sensing a second characteristic value of the electrical signals, having a first number of waves, received in a first modulation signal time period; having the sensing circuit module sensing a third characteristic value of the electrical signals, having a second number of waves, received in a second modulation signal time period; calculating a first ratio of the second characteristic value and the first characteristic value and calculating a second ratio of the third characteristic value and first characteristic value; and calculating the signal value according to a function of the first ratio, the second ratio, the first number of waves and the second number of waves.

Preferably, in order to save power by reducing number of waves, wherein the greatest common factor of the first number of waves and the second number of waves is 1, the function is corresponding to the result of the Formula 1.

Preferably, in order to reduce complexity of processing by the touch sensitive processing apparatus, the first, the second and the third characteristic values are signal strengths of the electrical signals in the reference signal time period, the first modulation signal time period and the second modulation signal time period, respectively.

Preferably, in order to restore original modulations of the electrical signals emitted by the stylus, the first, the second and the third characteristic values are duty cycles of the electrical signals in the reference signal time period, the first modulation signal time period and the second modulation signal time period, respectively.

Preferably, in order to prevent transmitting useless electrical signals where the stylus is far away from the touch panel or screen, the touch sensitive processing apparatus further comprises a driving circuit module, coupled to the multiple touch electrodes and the processor module, wherein the processor module is further configured for executing instructions stored in non-volatile memory for realize following: before the sensing circuit module sensing the first, the second and the third characteristic values, having the driving circuit module transmitting beacon signals via the multiple touch electrodes.

According to an embodiment of the present application, it provides a touch system for receiving a signal value. The touch system comprises a touch panel including multiple touch electrodes; and the aforementioned touch sensitive processing apparatus.

Preferably, in order to maintain completeness and compatibility, the touch system further comprises the transmitter which transmits the electrical signals.

According to an embodiment of the present application, it provides a touch sensitive processing method for receiving a signal value. The touch sensitive processing method comprising: sensing a first characteristic value of the electrical signals received in a reference signal time period; sensing a second characteristic value of the electrical signals, having a first number of waves, received in a first modulation signal time period; sensing a third characteristic value of the electrical signals, having a second number of waves, received in a second modulation signal time period; calculating a first ratio of the second characteristic value and the first characteristic value and calculating a second ratio of the third characteristic value and first characteristic value; and calculating the signal value according to a function of the first ratio, the second ratio, the first number of waves and the second number of waves.

Preferably, in order to save power by reducing number of waves, wherein the greatest common factor of the first number of waves and the second number of waves is 1, the function is corresponding to the result of the Formula 1.

Preferably, in order to reduce complexity of processing by the touch sensitive processing apparatus, the first, the second and the third characteristic values are signal strengths of the electrical signals in the reference signal time period, the first modulation signal time period and the second modulation signal time period, respectively.

Preferably, in order to restore original modulations of the electrical signals emitted by the stylus, the first, the second and the third characteristic values are duty cycles of the electrical signals in the reference signal time period, the first modulation signal time period and the second modulation signal time period, respectively.

Preferably, in order to prevent transmitting useless electrical signals where the stylus is far away from the touch panel or screen, the method further comprises: before the sensing circuit module sensing the first, the second and the third characteristic values, transmitting beacon signals via the multiple touch electrodes.

According to the touch sensitive processing method, apparatus and touch system provided by the present application, a signal value measured onboard a stylus can be transmitted to a touch sensitive processing apparatus via electrical signals transmitted in two or more time periods. Because the electrical signals transmitted in a reference signal time period is referenced, a ratio of the signal strengths or duty cycles in two time periods would not be changed according to various touch electrode density where the stylus points. Besides, two modulations can be applied to the electrical signals to carry more information in the same time.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A transmitter comprising:
    a signal modulator for transmitting electrical signals via an electrode, wherein the electrical signals carry a message representing a signal value; and
    a controller, coupled to the signal modulator, configured for having the signal modulator transmitting the electrical signals with a first duty cycle in a reference signal time period, transmitting the electrical signals with a second duty cycle in a modulation signal time period and transmitting the electrical signals with a third duty cycle in another modulation signal time period,
    wherein a first ratio is corresponding to the second duty cycle and the first duty cycle,
    wherein the lengths of the reference signal time period and the modulation signal time period are the same, and
    wherein the maximum amplitudes of the electrical signals during the reference signal time period and the modulation signal time period are the same,
    wherein the electrical signals transmitted during the modulation signal time period having a first number of waves, wherein the electrical signals transmitted during the another modulation signal time period having a second number of waves,
    wherein the signal value is corresponding to a function of the first ratio, a second ratio, the first number of waves and the second number of waves, where the second ratio is corresponding to the third duty cycle and the first duty cycle.

2. The transmitter as claimed in claim 1, wherein the first duty cycle is a predetermined fixed value, the transmitter is configured for modulating the electrical signals with the second duty cycle and the electrical signals with the third duty cycle according to the signal value.

3. The transmitter as claimed in claim 1, further comprises a sensor for measuring physical phenomena to generate the signal value, where the signal value is fallen in a range which is represented by three or more digits.

4. The transmitter as claimed in claim 3, wherein the transmitter is a stylus, the electrode is a tip electrode of the stylus, the sensor is configured for measuring the pressure force to the tip electrode, the signal value is a pressure value generated by the sensor.

5. The transmitter as claimed in claim 1, further comprises:
    a beacon signal sensor, which is coupled to the controller, configured for detecting beacon signals and notifying the controller,
    wherein the controller having the signal modulator transmitting the electrical signals with the first duty cycle in the reference signal time period and transmitting the electrical signals with the second duty cycle in the modulation signal time period in response to receiving of the notification from the beacon signal sensor.

6. The transmitter as claimed in claim 5, wherein the transmitter is a stylus, the electrode is a tip electrode of the stylus, the beacon signal detector detects the beacon signals emitted from a touch panel via the tip electrode.

7. The transmitter as claimed in claim 1, wherein the greatest common factor of the first number of waves and the second number of waves is 1, the function is corresponding to following value:

$$\frac{(\text{first number of waves} \times \text{first ratio}) + (\text{second number of waves} \times \text{second ratio})}{(\text{first number of waves} + \text{second number of waves})}$$

8. A method comprising:
    transmitting electrical signals with a first duty cycle via an electrode during a reference signal time period, wherein the electrical signals carry a message representing the signal value;

transmitting the electrical signals with a second duty cycle during a modulation signal time period;

transmitting the electrical signals with a third duty cycle in another modulation signal time period, wherein a first ratio is corresponding to the second duty cycle and the first duty cycle, wherein the lengths of the reference signal time period and the modulation signal time period are the same, wherein the maximum amplitudes of the electrical signals during the reference signal time period and the modulation signal time period are the same, wherein the electrical signals transmitted during the modulation signal time period having a first number of waves, wherein the electrical signals transmitted during the another modulation signal time period having a second number of waves, wherein the signal value is corresponding to a function of the first ratio, a second ratio, the first number of waves and the second number of waves, where the second ratio is corresponding to the third duty cycle and the first duty cycle.

9. The method as claimed in claim 8, wherein the first duty cycle is a predetermined fixed value, the electrical signals with the second duty cycle and the electrical signals with the third duty cycle are modulated according to the signal value.

10. The method as claimed in claim 8, wherein the signal value is generated by a sensor which measures physical phenomena, where the signal value is fallen in a range which is represented by three or more digits.

11. The method as claimed in claim 10, wherein the electrode is a tip electrode of a stylus, the sensor is configured for measuring the pressure force to the tip electrode, the signal value is a pressure value generated by the sensor.

12. The method as claimed in claim 8, further comprises:
detecting beacon signals; and
transmitting the electrical signals with the first duty cycle in the reference signal time period and transmitting the electrical signals with the second duty cycle in the modulation signal time period in response to the beacon signals are detected.

13. The method as claimed in claim 12, wherein the electrode is a tip electrode of a stylus, the detecting beacon signals step includes detecting the beacon signals emitted from a touch panel via the tip electrode.

14. The method as claimed in claim 8, wherein the greatest common factor of the first number of waves and the second number of waves is 1, the function is corresponding to following value:

$$\frac{(\text{first number of waves} \times \text{first ratio}) + (\text{second number of waves} \times \text{second ratio})}{(\text{first number of waves} + \text{second number of waves})}$$

\* \* \* \* \*